(12) United States Patent
Bour (10) Patent No.: US 7,759,689 B2
(45) Date of Patent: Jul. 20, 2010

(54) PHOTONIC CRYSTAL STRUCTURES AND METHODS OF MAKING AND USING PHOTONIC CRYSTAL STRUCTURES

(75) Inventor: David P. Bour, Cupertino, CA (US)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 391 days.

(21) Appl. No.: 11/745,027

(22) Filed: May 7, 2007

(65) Prior Publication Data
US 2008/0279242 A1 Nov. 13, 2008

(51) Int. Cl.
*H01L 33/00* (2010.01)
(52) U.S. Cl. .................. 257/96; 257/E33.067
(58) Field of Classification Search ........... 257/96–98, 257/E33.067, 14; 372/45.01, 43.01, 44.01, 372/50.1, 50.12
See application file for complete search history.

(56) References Cited

U.S. PATENT DOCUMENTS

| 6,362,069 B1 * | 3/2002 | Forrest et al. ............... 438/401 |
| 6,809,351 B2 * | 10/2004 | Kuramoto et al. ........... 257/190 |
| 6,828,591 B2 * | 12/2004 | Okuyama et al. ............. 257/89 |
| 6,870,190 B2 * | 3/2005 | Okuyama et al. ............. 257/79 |
| 2008/0036038 A1 * | 2/2008 | Hersee et al. ............... 257/615 |

\* cited by examiner

*Primary Examiner*—Davienne Monbleau
*Assistant Examiner*—Shweta Mulcare (57) ABSTRACT

A light emitting device having a buried photonic bandgap (PBG) structure is created using a relatively simple fabrication method known as epitaxial layer overgrowth (ELOG). By burying the PBG structure, the difficulties and disadvantages associated with the known technique of etching holes into a LED emission surface to form the PBG structure are avoided.

8 Claims, 9 Drawing Sheets

PHOTONIC CRYSTAL STRUCTURES AND METHODS OF MAKING AND USING PHOTONIC CRYSTAL STRUCTURES

TECHNICAL FIELD OF THE INVENTION

The invention relates to photonic crystal structures, and more particularly, to a photonic crystal structure that is buried between layers of a semiconductor device to provide improved external extraction efficiency.

BACKGROUND OF THE INVENTION

In the industry of electrical-to-optical light emitting devices, such as, for example, lasers and light emitting diodes (LEDs), attempts are continuously being made to improve the efficiency with which electrical power input to the device is converted into light, which is known as quantum efficiency. In order to improve the external quantum efficiency, $\eta_{ext}$, of a light emitting device such as a laser or an LED, it is desirable to maximize the injection efficiency, $\eta_{inj}$, into the active region and enhance the radiative recombination, $\eta_{rad}$, while maximizing the extraction efficiency $\eta_{out}$ out of the device. The overall external quantum efficiency is defined by the equation $\eta_{ext} = \eta_{inj}\eta_{rad}\eta_{out}$. The term $\eta_{inj}$ can be made close to unity by the introduction of hetero-barriers and multiquantum well active regions while the term $\eta_{rad}$ can be made close to unity by reducing the sources of non-radiative centers in poor quality epitaxial materials. The extraction efficiency $\eta_{out}$ for planar LEDs is limited by Snell's law to around 2 to 4% due to the large refractive index discontinuity at the semiconductor/air interface. Various devices and techniques, such as diffractive Bragg reflector (DBR) mirrors, textured surfaces, photon recycling, pyramidal shaping, and radial outcoupling tapering, are used to increase the extraction efficiency. Some of these devices and techniques have resulted in better than 50% improvement in extraction efficiency.

The main disadvantage of these devices and techniques is that they only enable a small fraction of the optical modes to be extracted from the light emitting devices. Leaky modes and guided modes are lost due to reabsorption of electrons in the unpumped active region. The number of optical modes can be controlled by reducing the size of the optical volume to the dimension of a wavelength. Introduction of a photonic crystal structure, also known as a bandgap (PBG) structure, into a light emitting device has been proposed to inhibit both the guided and leaky modes. A photonic bandgap structure controls the number of optical modes by introducing periodic reflections for all propagation directions. The periodic variations in the index profile generate a bandgap in the frequency domain where no optical modes are allowed. If there are no available optical modes, there can be no spontaneous emission. The PBG structure is designed to have the forbidden band at the transition frequency of the spontaneous emission. By introducing a defect (i.e., a missing period) in the photonic bandgap structure, the number of allowed optical modes can be controlled. Depending on its dimensions, a single defect in the photonic bandgap structure can be designed that allows a single optical mode to exist and that ensures that all of the spontaneous emission generated by electron-hole recombination can couple only to this mode. If this mode couples light efficiently out of the light emitting device, it will have very high external quantum efficiency.

LEDs with two-dimensional (2-D) PBG structures have been created. The 2-D PBG is typically formed by etching holes into the LED emission surface. For example, in an article entitled "InGaN/GaN QW heterostructure LEDs employing photonic crystal structures" published in *Applied Physics Letters* 84, 3885 (2004), J. Wierer et al. describe such a device. These methods have not resulted in tremendous enhancements in the external quantum efficiency of LEDs, primarily because of the way in which the PBG is fabricated. In all cases, etched holes are use to generate the periodic index variations, which result in 1) poor injection efficiency into the active region, and 2) increased non-radiative recombination at the etched surface (i.e., surface states). In addition, bottom reflectors are used to extract the light output, which is not extremely efficient mechanism for extracting light.

Accordingly, a need exists for a photonic crystal structure that has improved external extraction efficiency and that does not rely on creating a 2-D PBG by etching holes into an LED emission surface.

SUMMARY OF THE INVENTION

The invention provides a light emitting device having improved extraction efficiency and a method for making the light emitting device. The light emitting device comprises a substrate having a top surface, a buffer layer of Gallium Nitride (GaN) disposed on the top surface of the substrate, a dielectric mask layer having a pattern of openings formed therein, n-type or p-type GaN disposed on the buffer layer and extending vertically and laterally through each of the openings formed in the dielectric mask layer, one or more quantum well (QW) structures disposed above or below the patterned dielectric mask layer to form an active region within the light emitting device, and a layer of n-type or p-type GaN disposed above the active region. The GaN extending vertically and laterally through the openings formed in the dielectric mask layer creates a periodically varying refractive index profile in the light emitting device that promotes confinement of light in the active region, which, in turn, improves extraction efficiency. If the GaN extending vertically and laterally through the openings formed in the dielectric mask layer is n-type GaN, then the layer of GaN disposed above the active region is p-type GaN. If the GaN extending vertically and laterally through the openings formed in the dielectric mask layer is p-type GaN, then the GaN disposed above the active region is n-type GaN.

The method for making the light emitting device comprises forming a dielectric mask layer having a pattern of openings in a layer of p-type or n-type GaN disposed on a substrate, growing n-type or p-type GaN under conditions that are selected to cause the GaN to grow vertically and laterally in a controlled manner such that the GaN extends vertically and laterally through the openings formed in the dielectric mask layer, growing one or more QW at one or more locations above or below the patterned dielectric mask layer to provide an active region in which electrons are converted into photons, and growing a layer of n-type or p-type GaN above the active region. If the GaN that extends vertically and laterally through the openings formed in the dielectric mask layer is n-type GaN, then the GaN grown above the active region is p-type GaN. If the GaN that extends through the openings formed in the dielectric mask layer is p-type GaN, then the GaN grown above the active region is n-type GaN.

These and other features and advantages of the invention will become apparent from the following description, drawings and claims.

DETAILED DESCRIPTION OF ILLUSTRATIVE EMBODIMENTS

A relatively simple method is provided for fabricating a 2-D PBG, also referred to herein as a photonic crystal structure, using epitaxial layer overgrowth (ELOG) as the fabrication process. The photonic crystal structure preferably is completely buried, thereby eliminating the aforementioned difficulties and disadvantages associated with the aforementioned method of etching holes into a LED emission surface.

Figure 1:
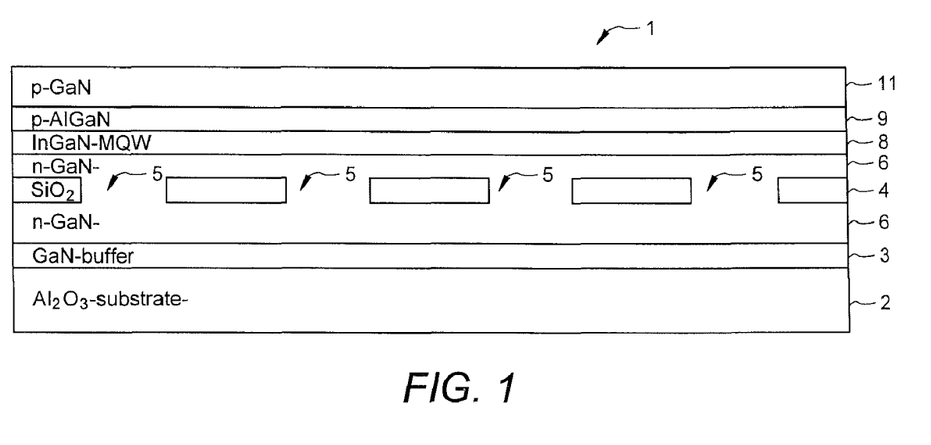
FIG. 1 illustrates a cross-sectional side view of a portion of a semiconductor device having a photonic crystal structure buried therein in accordance with an illustrative embodiment.
Figure 2:
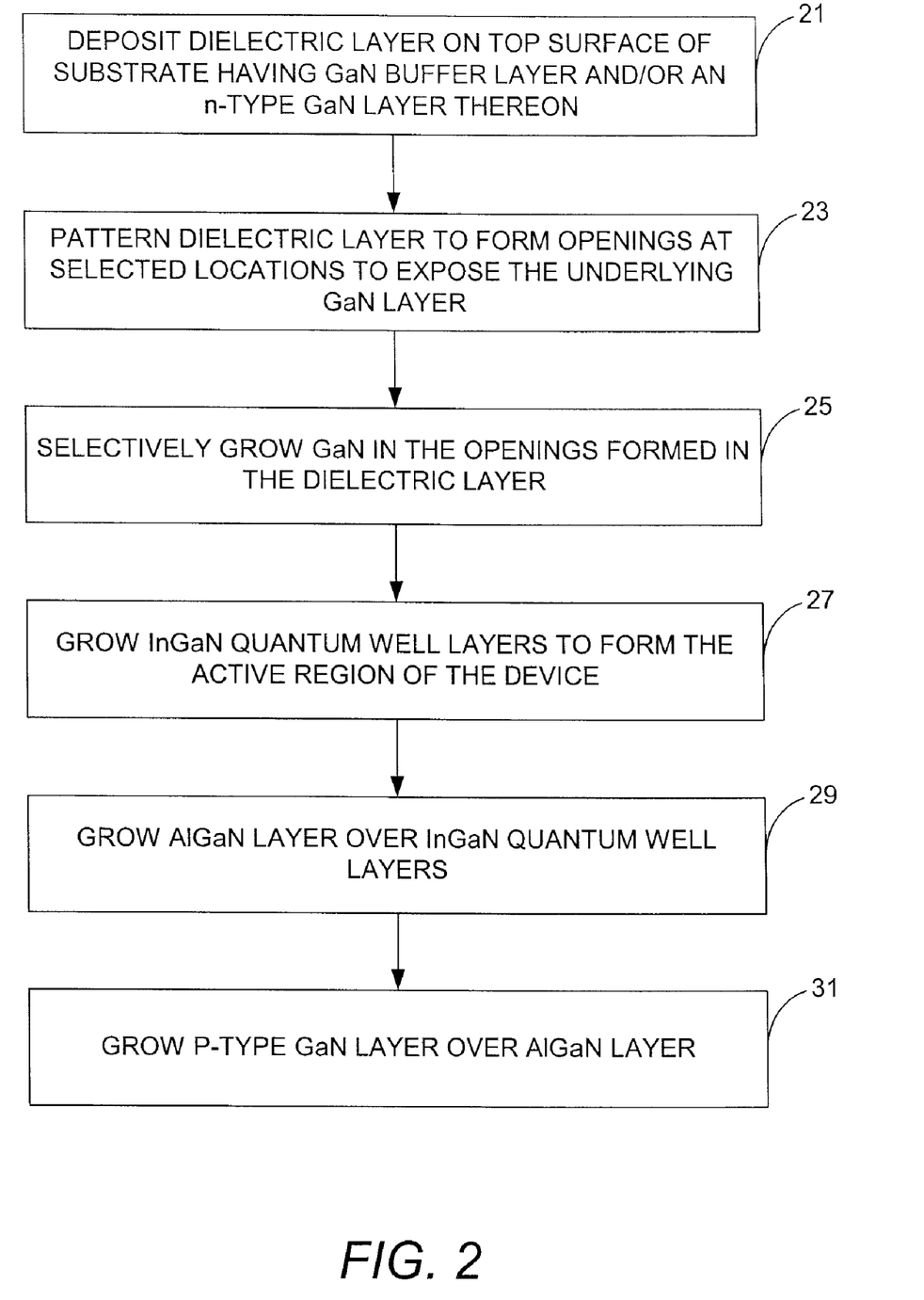
FIG. 2 illustrates a flowchart that represents the method in accordance with an embodiment for making the semiconductor device shown in FIG. 1.

FIG. 1 illustrates a cross-sectional side view of a portion of a semiconductor device 1 having a photonic crystal structure buried therein in accordance with an illustrative embodiment. FIG. 2 illustrates a flowchart that represents the method in accordance with an embodiment for making the semiconductor device 1 shown in FIG. 1. The parts of the semiconductor device 1 shown in FIG. 1 will be described with reference to the manner in which they are formed in the device 1 using the method represented by the flowchart shown in FIG. 2.

A dielectric layer 4 of Silicon Dioxide ($SiO_2$) is deposited on top of a buffer layer of Gallium Nitride (GaN) 3 formed on the top surface (0001) of a sapphire ($Al_2O_3$) substrate 2. This step is performed in a reactor (not shown) under conditions (e.g., temperatures) suitable for depositing the $SiO_2$ dielectric layer 4. Alternatively, the dielectric layer 4 may instead be deposited over some thicker (e.g., ~2 micrometers (μm)) n-type GaN layer that has previously been deposited over the buffer layer 3. The buffer layer 3 functions as a nucleation layer to grow the subsequent GaN epitaxial layers and preferably contains many dislocations. The step of depositing the dielectric layer 4 is represented by block 21 in FIG. 2.

The device 1 comprising the substrate 2 and layers 3 and 4 is removed from the reactor and subjected to a patterning process (e.g., etching) through which openings 5 are formed in the dielectric layer 4 to expose the underlying GaN buffer layer 3 through openings 5. This step is represented by block 23 in FIG. 2. The pattern is periodic and preferably is chosen to generate a 2-D photonic crystal with a single defect, as will be described in more detail below with reference to FIG. 5. For example, a hexagonal array of circular openings 5 may be generated in the dielectric layer 4. The diameter of the openings and the spacing between the openings are chosen to be close to a dimension of the wavelength of light in GaN, as will be described below with reference to FIGS. 7A and 7B.

After the patterning process represented by block 23 in FIG. 2 has been performed, the device 1 is returned to the reactor and n-type GaN 6 is grown selectively in the etched openings 5, as indicated by block 25 in FIG. 2. The reactor conditions, such as, for example, growth temperature, V:III ratio, and/or growth pressure, may be adjusted to control the lateral and vertical growth rates of the GaN 6. In the example of the device 1 represented by FIG. 1, the reactor conditions have been selected to allow the GaN to be grown with a lateral growth rate that is higher than the vertical growth rate so that coalescence and planarization of the GaN layer 6 occurs.

After the GaN 6 has coalesced to form a generally planar top surface, the growth conditions in the reactor are changed and the Indium Gallium Nitride (InGaN) quantum well (QW) layers 8 that form the active region are grown on the top surface of the n-type GaN layer 6. This step is represented by block 27 in FIG. 2. The conditions in the reactor are then varied again and a confinement layer 9 of p-type Aluminum Gallium Nitride (AlGaN) is grown over the QW layers 8, as indicated by block 29 in FIG. 2. A contact layer 11 of p-type GaN is then grown over the AlGaN confinement layer 9, as indicated by block 31.

The device 1 comprising the components 2-11 constitutes a PIN LED structure. The invention, however, is not limited to LED structures, but applies to other types of light emitting devices as well, such as lasers, for example. The periodicity of the pattern of openings 6 formed in the dielectric layer 4 results in a periodic variation in the refractive index of the n-type GaN layer 6 that surrounds the dielectric layer 4. This periodic variation in the refractive index of the n-type GaN layer 6 beneath the active region comprising the QW layers 8 forms the PBG structure of the device 1. Thus, the PBG structure is buried within the device 1 below the active region and causes light at the operating wavelength to be directed into the active region and confined within the active region by internal reflection, which improves the extraction efficiency of the device 1 over that obtained by known light emitting devices.

Figure 3:
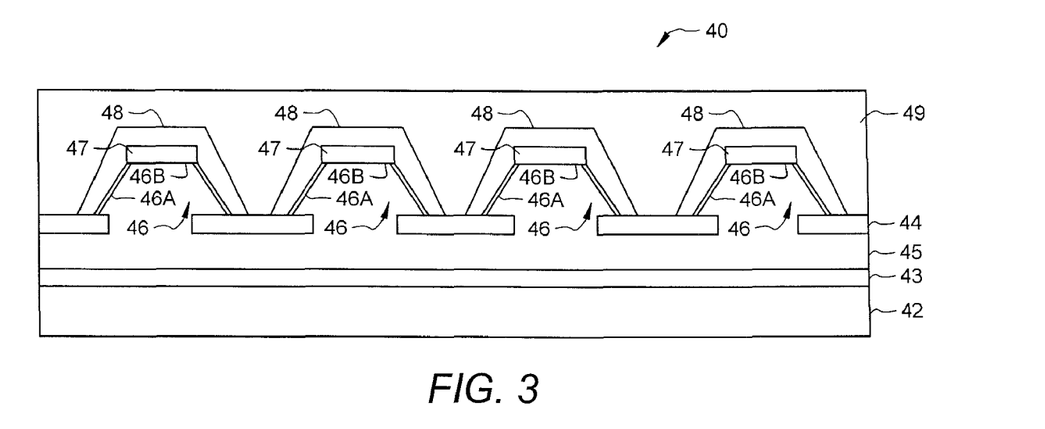
FIG. 3 illustrates a cross-sectional diagram of a semiconductor device having a photonic crystal structure buried therein in accordance with another illustrative embodiment.

FIG. 3 illustrates a cross-sectional diagram of a semiconductor device 40 having a photonic crystal structure buried therein in accordance with another illustrative embodiment. The same materials that are used to make the device 1 shown in FIG. 1 are used to make the device 40 shown in FIG. 3. Also, the method represented by FIG. 2 is used to create the device 40 except that a few of the steps have been modified. Steps 21 and 23 are used to grow the GaN buffer layer 43 on the sapphire substrate 42, deposit the dielectric layer 44 on the buffer layer 43, and pattern the dielectric layer 44. The n-type GaN layer 45 is then grown during the step represented by block 25. When performing the step represented by block 25, the growth conditions in the reactor are selected so that the vertical growth rate is higher than the horizontal growth rate. This causes generally pyramidal-shaped n-type GaN structures 46 having hexagonally-shaped bases and sidewalls 46A to be formed due to the fact that GaN has a hexagonal crystal structure. Coalescence of the n-type GaN 45 is prevented because before the n-type GaN 45 is able to coalesce, the step represented by block 27 is performed to grow the InGaN QW layers 47. The growth conditions in the reactor are selected to favor vertical growth of the QW layers 47 to minimize the QW thickness on the sidewalls 46A of the pyramidal structures 46 and suppress injection along this parasitic junction. In fact, the Indium will naturally tend to accumulate at the top of the mesas 46B of the pyramidal structures 46. Following the growth of the InGaN QW layers 47, a p-type AlGaN confinement layer 48 and a p-type GaN contact layer 49 are grown to complete the device 40, which is also PIN LED device, although other types of light emitting devices may also be formed using this process.

By terminating the process of growing the n-type GaN 45 before coalescence and planarization has occurred, a large refractive index discontinuity is formed between the islands comprising the mesas 46B having the QW layers 47 formed thereon. Thus, the periodic variations in the refractive index are formed in the active region itself, as opposed to being formed below the active region, as is the case with the device 1 shown in FIG. 1. By creating the periodic variations in the refractive index in the active region itself, the confinement of light in the active region is even better than in the case represented by FIG. 1, which leads to the device 40 having even greater extraction efficiency than the device 1 shown in FIG. 1. Openings and metal contacts may be placed on the p-type and n-type regions to facilitate current injection into the InGaN active regions 47.

Figure 4:
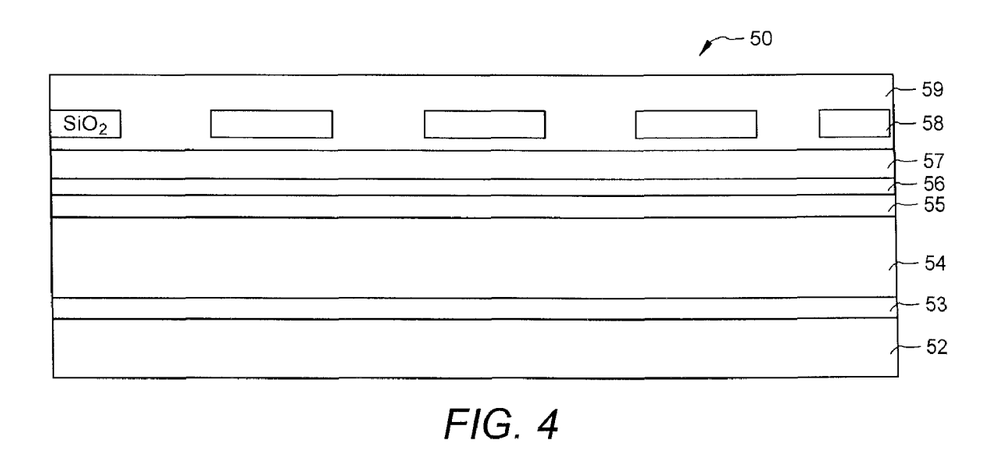
FIG. 4 illustrates a cross-sectional side view of a portion of a semiconductor device having a photonic crystal structure buried therein in accordance with another illustrative embodiment.
Figure 5:
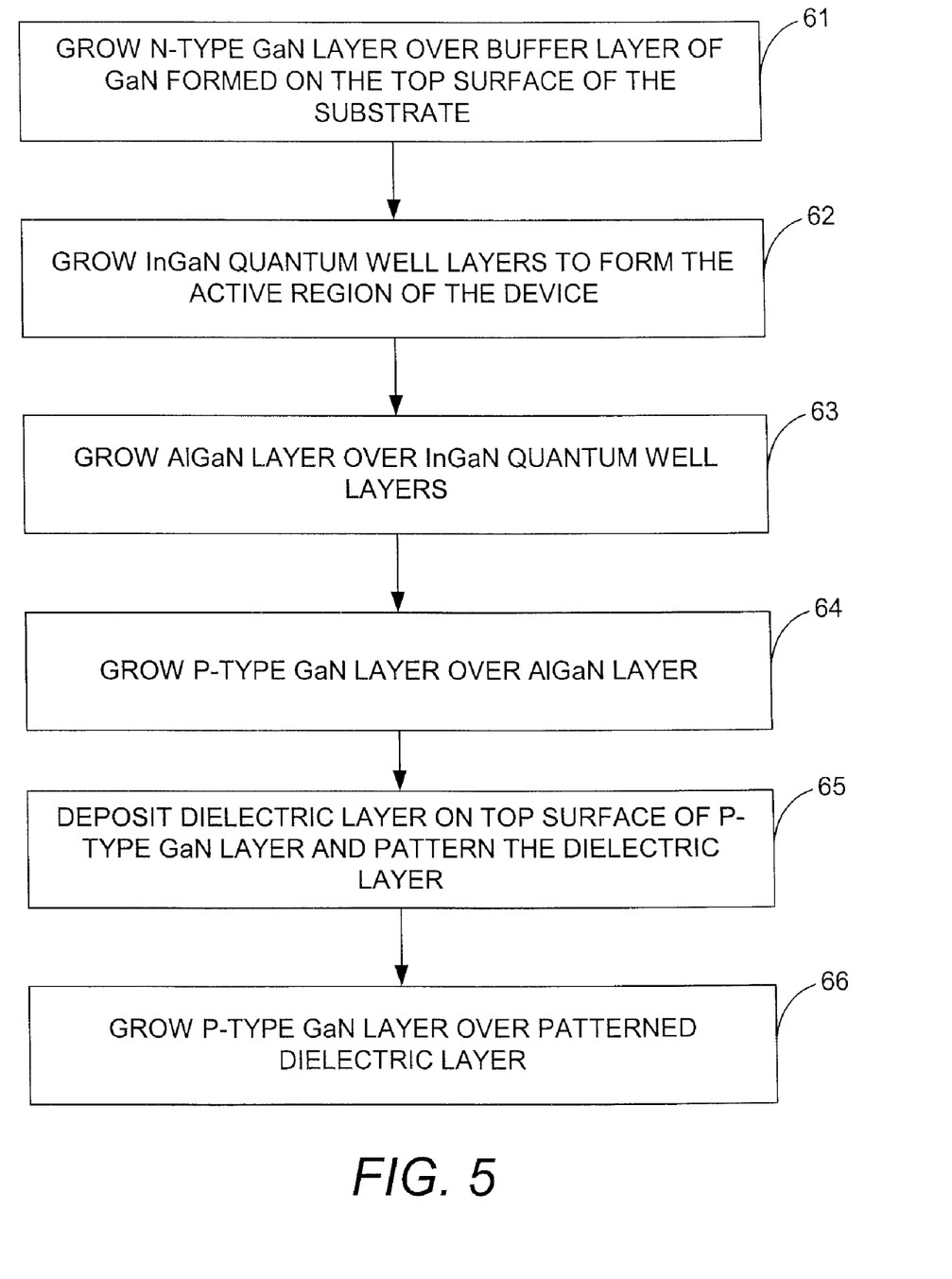
FIG. 5 illustrates a flowchart that represents the method in accordance with an embodiment for making the semiconductor device shown in FIG. 4.

FIG. 4 illustrates a cross-sectional side view of a portion of a semiconductor device 50 having a photonic crystal structure buried therein in accordance with another illustrative embodiment. The device 50 is similar to the device 1 shown in FIG. 1 except that in the device 50, the active region 55 is below the patterned dielectric layer 57. FIG. 5 illustrates a flowchart that represents the method in accordance with an embodiment for making the semiconductor device 50 shown in FIG. 4. The parts of the semiconductor device 50 shown in FIG. 4 will be described with reference to the manner in which they are formed in the device 50 using the method represented by the flowchart shown in FIG. 5.

A layer 54 of n-type GaN is grown on top of the buffer layer 53 of GaN formed on the top surface (0001) of a sapphire substrate 52 in a reactor, as indicated by block 61 in FIG. 4. The reactor conditions are changed and the InGaN QW layers 55 that form the active region are grown on the top surface of the n-type GaN layer 54. This step is represented by block 62 in FIG. 4. The conditions in the reactor are then varied again and a layer 56 of p-type AlGaN is grown over the QW layers 55, as indicated by block 63 in FIG. 4. A layer 57 of p-type GaN is then grown over the AlGaN layer 54, as indicated by block 64. A dielectric layer 58 is SiO2 is then deposited over the p-type GaN layer 57 and patterned, as indicated by block 65. A layer 59 of p-type GaN is then grown over the patterned dielectric layer 58, as indicated by block 66.

The device 50 functions in a manner that is similar to the manner in which the device 1 functions and achieves improved extraction efficiency relative to the known light emitting devices described above that have holes etched in their top surfaces. The device 50 constitutes a PIN LED structure. As stated above, however, the invention is not limited to LED structures, but applies to other types of light emitting devices as well, such as lasers, for example. As with the device 1 shown in FIG. 1, the periodicity of the pattern of openings formed in the dielectric layer 58 of the device 50 results in a periodic variation in the refractive index of the p-type GaN layers 57 and 59 that surround the dielectric layer 58. This periodically varying refractive index in the p-type GaN layers 57 and 59 is above the active region comprising the QW layers 55 and forms the PBG structure of the device 50. Burying the PBG structure within the device 50 above the active region causes light at the operating wavelength to be directed into the active region and confined within the active region by internal reflection, which improves the extraction quantum efficiency of the device 50 over that obtained by known light emitting devices.

Figure 6:
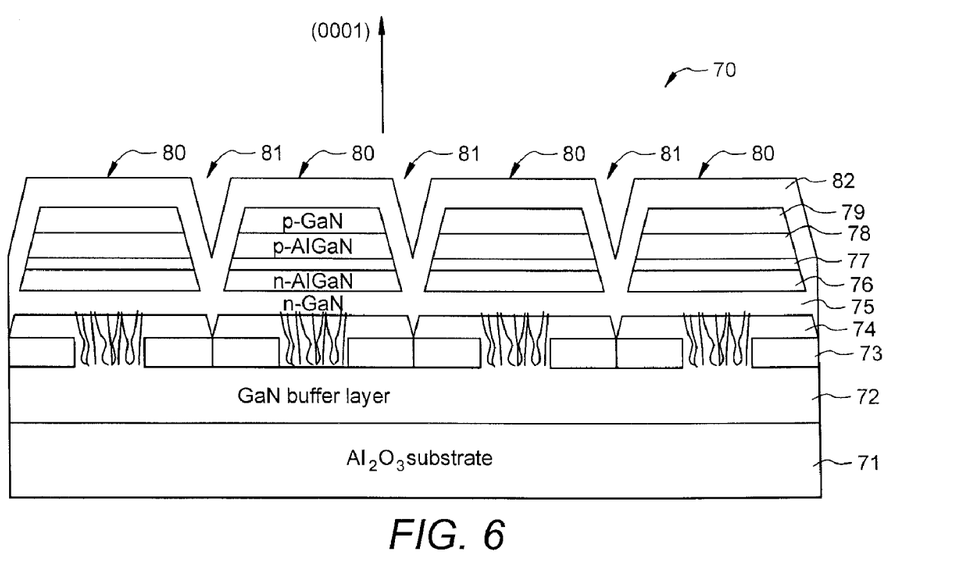
FIG. 6 illustrates a cross-sectional side view of a portion of a semiconductor device having a photonic crystal structure buried therein in accordance with another illustrative embodiment.

FIG. 6 illustrates a cross-sectional side view of a portion of a semiconductor device 70 having a photonic crystal structure buried therein in accordance with another illustrative embodiment. The device 70 is similar to the device 1 shown in FIG. 1 in that it has a GaN buffer layer 72 on a surface of a sapphire substrate 71 and a patterned dielectric layer of SiO2 73 on top of the buffer layer 72. A layer of p-type GaN 74 is then grown on top of the dielectric layer 73 and in the openings formed in the dielectric layer 73. The following layers are then grown in the following order: an n-type GaN layer 75; an n-type AlGaN layer 76; the InGaN QW layers 77; a p-type AlGaN layer 78; and a p-type GaN layer 79. Subsequent to growing these layers, openings 81 are etched down to the patterned dielectric layer 73 to form islands 80. A layer of n-type GaN 82 is then grown over the islands 80. Because the islands 80 repeat periodically, they provide a periodic variation in the refractive index of all of the layers of the device 70 including the QW layers 77. This periodic variation in the refractive index complements the periodic variation in the refractive index provided by the growth of the p-type GaN layer 74 in the openings formed in the dielectric layer 73. Thus results in even better confinement of the light in the active region 77 and consequently, improved extraction quantum efficiency for the device 70 relative to known light emitting devices.

Figure 7A:
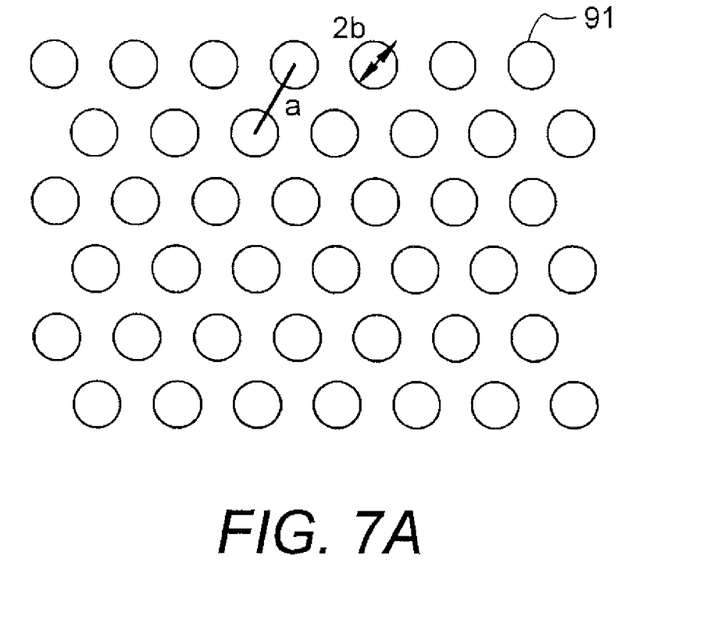
FIGS. 7A and 7B are top views of any one of the light emitting devices shown in FIGS. 1, 3, 4, and 6.
Figure 7B:
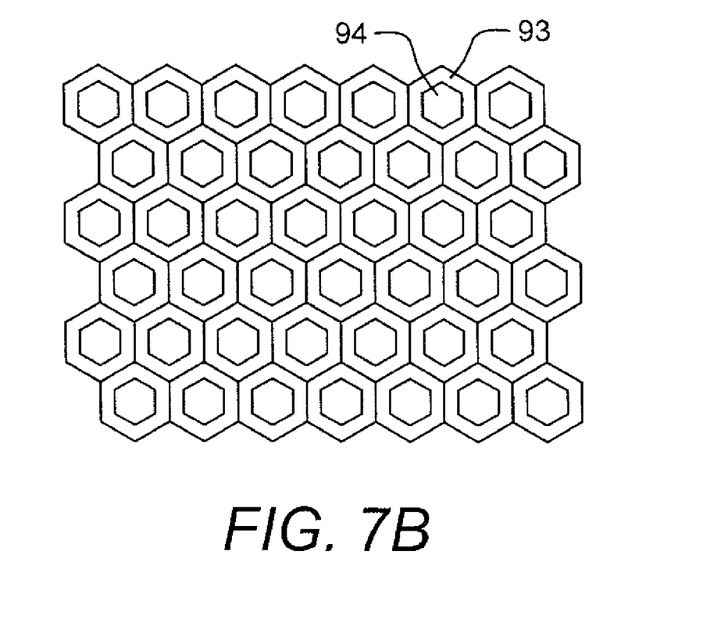

FIGS. 7A and 7B are top views of the light emitting device shown in FIG. 3. The top view shown in FIG. 7A shows the GaN buffer layer beneath the circular openings 91 formed in the dielectric layer prior to the n-type GaN being grown. As stated above, the openings 91 have a diameter and spacing that are chosen to be close to the wavelength of light in GaN, or some fraction of the wavelength. The diameter is typically ½ or ¼ of the wavelength of light in GaN. The spacing is typically about twice the diameter of the openings 91. The top view shown in FIG. 7B shows the n-type GaN 94 grown over the circular openings formed in the dielectric layer 93. The p- or n-type GaN grows laterally to form hexagonal bases over the openings. The conditions in the reactor are chosen so that vertical growth is favored over lateral growth so that the generally pyramidal-shaped structures are formed in the n-type GaN and coalescence of the n-type GaN is not allowed to occur.

Figure 8:
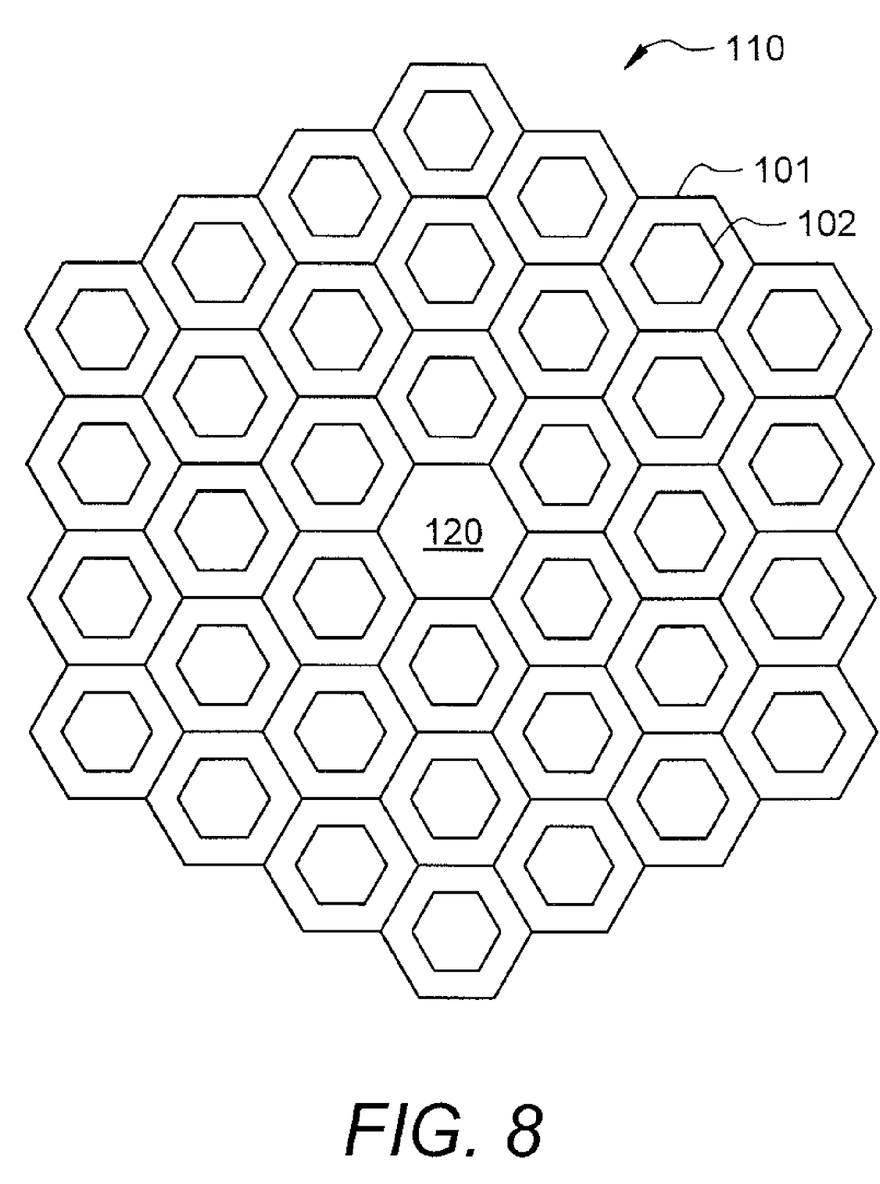
FIG. 8 illustrates a top view of any one of the devices shown in FIGS. 1, 3, 4, and 6 in which the light emitting device has been fabricated into a hexagonal array that includes a single defect at the center of the array.

FIG. 8 illustrates a top view of the device shown in FIG. 3 in which the light emitting device has been fabricated into a hexagonal array 110 of pyramidal-shaped structures that includes a single defect 120 at the center of the array 110. The top view shows the patterned dielectric layer 111 having the p- or n-type GaN hexagonal pyramidal-shaped structures 112 grown thereon. The defect 120 is an area in the dielectric layer that has not been removed by etching. The light generated by the array 110 will be coupled out of the array 110 through the defect 120. The defect 120 confines light and limits modes to improve extraction efficiency.

The external quantum efficiency of semiconductor LED devices is limited primarily by their poor extraction efficiency. Thus, while the internal quantum efficiency often approaches 100%, the external quantum efficiency is typically much less due to the small light escape cones provided in typical LED devices. The high refractive index of the typical semiconductor device often contributes to this, because it causes much of the emitted light to undergo total internal reflection (TIR) rather than escaping the LED device. Subsequently, the TIR-light is likely to be reabsorbed in either the active region or in the contact electrodes. Among the many known strategies developed for improving LED extraction efficiency are chip surface roughening, which promotes diffuse scattering of light out of the semiconductor device rather than TIR, incorporation of a photonic bandgap structure in the semiconductor device, and shaping of the semiconductor surface to enhance outcoupling of light and reduce TIR.

It is known that the extraction efficiency can be greatly improved by shaping the LED device to reflect light out of the device rather than allowing it to recirculate and experience absorption in the active region. This has been demonstrated in known devices such as LumiLeds for AlGaInP LEDs with a truncated-pyramid shape formed by sawing the chip sidewalls at an angle. Similar chip-shaping techniques could also benefit GaN-based LEDs on sapphire or Silicon Carbon (SiC) substrates, such as those shown above in FIGS. 1, 3, 4, and 6. However, these materials are extremely difficult to saw or cleave with precision.

Figure 9:
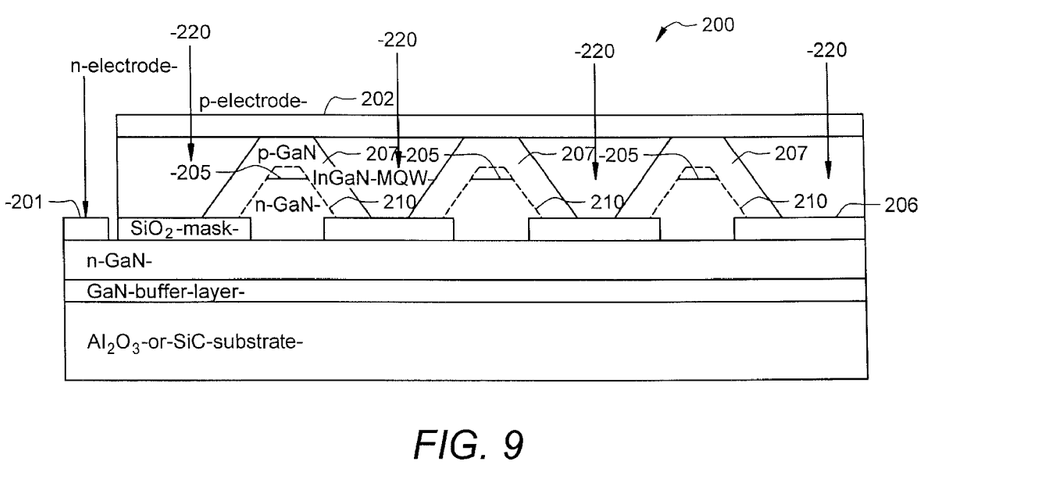
FIG. 9 illustrates a schematic cross-sectional diagram of a LED device having the pyramidal microstructures formed therein for improving quantum extraction efficiency.

FIG. 9 illustrates a schematic cross-sectional diagram of a LED device 200 having generally pyramidal-shaped microstructures 210 formed therein in accordance with an embodiment. In accordance with an aspect of the invention, it has been determined that the natural tendency for GaN to form the generally pyramidal-shaped structures described above with reference to FIG. 3 during growth may be used to form analogous shapes that provide the light emitting device with a roughened surface that promotes light extraction. The selective growth of GaN pyramid crystallites in a dot-patterned mask was demonstrated by H. X. Jiang et al., in "Optical resonance modes in GaN pyramid microcavities", *Applied Physics Letters* 75, 763 (1999), which is incorporated by reference herein. In accordance with an embodiment, these shapes are formed at a microstructural scale rather than at a full-chip shaping scale. Thus, while the distance between the generally pyramidal-shaped structures 46 shown in FIG. 3 is on the order of a wavelength of light in GaN (nanometer scale), the distance between the generally pyramidal-shaped microstructures 210 used for this purpose is much greater, i.e., typically on the order of from about 50 to 150 micrometers. As described above, these micrometer-sized pyramidal structures form spontaneously during lateral epitaxial growth of GaN in the dot-patterned dielectric layer mask in the manner described above with reference to FIG. 3. The shapes of these microstructures 210 are appropriate for scattering light out of the device 200 rather than allowing the light to be reflected, recirculated and reabsorbed in the active region. Consequently, the outcoupling quantum efficiency of the light emitting device 200 is improved.

Unlike the device 40 shown in FIG. 3, the device 200 includes a dielectric insulating material or metallic material (e.g., Aluminum, Silver, etc.) 220 disposed in the volume between the pyramidal-shaped microstructures 210. If the material 220 is reflective, it will reflect light generated in the active region out of the device 200 to prevent the light from being reabsorbed in the active region, thereby improving extraction efficiency. If the material 220 is an insulating dielectric material, it will absorb light generated in the active region and reflected downward to prevent the light from being reabsorbed in the active region, which also improves extraction efficiency. The device 200 has metal contacts 201 and 202 for injecting current into the active region formed by the InGaN and AlGaN layers 205. Using the method described above with reference to FIG. 2 to create the device 200, in the step represented by block 25, the conditions in the reactor are chosen so that the vertical growth rate is higher than the lateral growth rate of the n-type GaN, which causes the pyramidal-shaped microstructures 210 to be formed. At least the top portions of the pyramidal-shaped microstructures 210 are covered with the InGaN and AlGaN layers 205 that make up the MQW structure. The InGaN and AlGaN layers 205 are then covered by a layer of p-type GaN 207 to form the p-n junction between the p-type GaN 207 and the n-type GaN 210.

The circular openings, or dots, that are patterned into the dielectric mask layer 206 are typically about 1 to about 20 microns in diameter, and they are typically patterned in a two dimensional array that maximizes the packing density while still leaving the hexagonal pyramidal shape intact (i.e., the pyramids have not merged). The shape of the pyramidal structures 210 may also be controlled through the reactor growth conditions by making variations in growth temperatures and pressures, as disclosed in "Fabrication and characterization of low-defect-density GaN using FACELO", by K. Hiramatsu et al, *Journal of Crystal Growth* 221, 316 (2000), which is incorporated by reference herein. At lower pressures, the pyramidal-shaped microstructures 210 are generally flat, but wide (corresponding to fast lateral growth), while at higher pressures, the pyramidal-shaped microstructures 210 taper to points. Consequently, by controlling the growth temperature, pressure, rate, and V:III ratio, the geometry of the pyramidal-shaped microstructures can be controlled. Accordingly, the growth conditions are adjusted to yield a final net shape that maximizes the extraction efficiency.

In general, the hexagonal pyramidal-shaped microstructures that spontaneously form when GaN is grown in dot-patterned masks can enhance the extraction efficiency of light emitting devices, such as nitride semiconductor LED devices, for example. This extraction efficiency improvement is completely analogous to that achieved by the known technique of bevel-sawing AlInGaP LED devices. However, the GaN pyramidal-shaped microstructures 210 shown in FIG. 9 are of micrometer-scale dimensions. During growth of the InGaN and AlGaN MQW layers 205, the InGaN is favorably incorporated at the tops of the pyramid structures 210 or truncated pyramids (not shown). Because the growth occurs over such a small area, dislocation generation may be suppressed for LEDs with high Indium alloy content, especially in green LED devices. Thus, in addition to enhancing the extraction efficiency, the internal quantum efficiency may also be enhanced. In an extreme limit, an InGaN quantum dot active region may be formed at the vertex of the pyramid, and then buried in AlGaN. For the masked starting sample, the dot size may be chosen to optimize the individual LED crystallite performance in terms of efficiency, color purity, voltage, etc., with the growth conditions determining the pyramidal geometry. Likewise, the pitch of the dots may be chosen to give an optimal packing density of pyramidal crystals in order to increase the light output of the device. The thickness of the dielectric mask should also be optimized. Ideally, it should serve as an anti-reflection coating so that light reflected downward off of the surfaces of the pyramidal-shaped microstructures passes through it to be extracted from the device.

In addition to the shape of the pyramidal microstructures, the placement and shape of the InGaN/AlGaN MQW emission region within the pyramid also plays a role in determining the extraction efficiency. This may be optimized through control of the growth conditions and quantity of material grown before the InGaN/AlGaN MQW layers 205 and for the material grown over the MQW layers 205. For example, if the InGaN is grown at the very tip of a pyramidal-shaped structure 210 and then buried in AlGaN, the buried MQW will behave as a point source of light. Alternatively, the InGaN/AlGaN MQW layers 205 may be deposited before the hexagon has formed a vertex, in which case a small planar active region (i.e., a mesa) may be formed before the InGaN/AlGaN layers are grown. The pyramidal-shaped microstructures may also be applied beneficially to ultraviolet AlInGaN MQW LED devices. Another interesting result in the process is that the growth of the pyramidal-shaped microstructures can enhance the incorporation of Indium in the InGaN QW layers, which may lead to longer wavelength operation.

It should be noted that the invention has been described with reference to illustrative embodiments and that the invention is not limited to these embodiments. Many variations may be made to the embodiments described herein and all such variations are within the scope of the invention. For example, after the light emitting devices have been created, the patterned dielectric layers may be etched away to leave an airgap photonic bandgap structure having an even stronger index of refraction periodic variation. In addition, while the light emitting devices have been described with reference to particular materials, the invention is not limited to using any particular materials to make the light emitting devices. The materials described above are merely examples of materials that are suitable for the purposes described herein, although other materials are suitable for these purposes as well.

What is claimed is:

1. A light emitting device having improved quantum efficiency, the light emitting device comprising:
    a substrate having a top surface;
    a buffer layer of Gallium Nitride (GaN) disposed on the top surface of the substrate;
    a dielectric mask layer having a pattern of openings formed therein;
    a layer of n-type or p-type GaN disposed on the buffer layer and extending vertically through each of the openings formed in the dielectric mask layer and extending laterally away from a periphery of each opening both immediately above and immediately below each opening, the GaN extending vertically and laterally through the openings formed in the dielectric mask layer to create a periodically varying refractive index profile in the light emitting device;
    a quantum well (QW) layer disposed above the patterned dielectric mask layer and above the layer of GaN that extends vertically through the openings formed in the dielectric mask layer, said QW layer providing an active region of the light emitting device in which electrons are converted into photons, said periodically varying refractive index profile promoting confinement of light in the active region; and
    a layer of n-type or p-type GaN disposed above the active region, wherein if the GaN extending vertically and laterally through the openings formed in the dielectric mask layer is n-type GaN, then the layer of GaN disposed above the active region is p-type GaN, and wherein if the GaN extending vertically and laterally through the openings formed in the dielectric mask layer is p-type GaN, then the GaN disposed above the active region is n-type GaN.

2. The light emitting device of claim 1, wherein said one or more QW structures comprises one or more layers of Indium Gallium Nitride (InGaN), the light emitting device further comprising:
    a layer of Aluminum Gallium Nitride (AlGaN) covering said QW layer.

3. The light emitting device of claim 2, wherein the n-type or p-type GaN disposed on the buffer layer is n-type GaN, said QW layer being disposed on top of at least portions of the n-type GaN.

4. The light emitting device of claim 3, wherein the layer of n-type or p-type GaN disposed above said QW layer is a layer of p-type GaN, the layer of p-type GaN being disposed on top of the layer of AlGaN.

5. The light emitting device of claim 4, wherein the n-type GaN extending vertically and laterally through each of the openings formed in the dielectric mask layer merges laterally above the dielectric mask layer with n-type GaN extending vertically and laterally through others of the openings formed in the dielectric mask layer to form a layer of n-type GaN having a generally merged, planarized top surface on which said one or more layers comprising said QW layer are disposed.

6. The light emitting device of claim 4, wherein the dielectric mask layer is disposed above said one or more QW structures, and wherein the p-type GaN disposed above said one or more QW structures extends vertically and laterally through each of the openings formed in the dielectric mask layer and forms a layer of p-type GaN having a generally merged, planarized top surface.

7. The light emitting device of claim 1, wherein the light emitting device is a light emitting diode (LED) device.

8. The light emitting device of claim 1, wherein the light emitting device is incorporated into a laser device.

* * * * *